(12) United States Patent
Ghaderi et al.

(10) Patent No.: US 6,960,942 B2
(45) Date of Patent: Nov. 1, 2005

(54) HIGH SPEED PHASE SELECTOR

(75) Inventors: Bahram Ghaderi, Cupertino, CA (US); Vincent Tso, Milpitas, CA (US); Sunil Jaggia, Los Altos, CA (US); Johnny Lee, Santa Clara, CA (US)

(73) Assignee: Exar Corporation, Fremont, CA (US)

( * ) Notice: Subject to any disclaimer, the term of this patent is extended or adjusted under 35 U.S.C. 154(b) by 562 days.

(21) Appl. No.: 09/860,723

(22) Filed: May 18, 2001

(65) Prior Publication Data

US 2002/0174374 A1 Nov. 21, 2002

(51) Int. Cl.$^7$ ............................ H03K 17/00; H03K 3/00
(52) U.S. Cl. ........................ 327/99; 327/299; 327/407
(58) Field of Search ........................ 327/99, 299, 407, 327/298; 713/500

(56) References Cited

U.S. PATENT DOCUMENTS

| | | | | |
|---|---|---|---|---|
| 4,820,992 A | | 4/1989 | Avis ............................ 327/298 |
| 4,853,653 A | * | 8/1989 | Maher .......................... 331/49 |
| 4,888,729 A | | 12/1989 | Nelson ......................... 375/371 |
| 5,018,169 A | | 5/1991 | Wong et al. ................. 375/373 |
| 5,317,202 A | * | 5/1994 | Waizman ..................... 327/156 |
| 5,521,499 A | * | 5/1996 | Goldenberg et al. ........ 327/237 |
| 5,689,530 A | | 11/1997 | Honaker, Jr. ................ 375/286 |
| 6,323,715 B1 | * | 11/2001 | Vatinel ......................... 327/407 |
| 6,407,606 B1 | * | 6/2002 | Miura .......................... 327/241 |
| 6,411,134 B1 | * | 6/2002 | Manz et al. .................. 327/99 |
| 6,452,426 B1 | * | 9/2002 | Tamarapalli et al. .......... 327/99 |
| 6,617,893 B1 | * | 9/2003 | Born et al. ................. 327/115 |
| 2001/0040888 A1 | * | 11/2001 | Guinea et al. | |
| 2002/0075042 A1 | * | 6/2002 | Ohkawa | |
| 2002/0140481 A1 | * | 10/2002 | Tschanz et al. ............. 327/218 |

FOREIGN PATENT DOCUMENTS

EP            0419161 A2      3/1991

* cited by examiner

*Primary Examiner*—Tuan T. Lam
(74) *Attorney, Agent, or Firm*—Townsend and Townsend and Crew LLP

(57) ABSTRACT

Method and circuitry for selecting phases while avoiding glitches in the output signal during phase switching. An integrated circuit having a plurality of input terminals coupled to receive a respective plurality of clock signals having different phases, and a plurality of control terminals coupled to receive a respective plurality of phase selection signals. The circuit is configured to output a first selected clock signal from the plurality of clock signals in response to a first combination of the phase selection signals, and further configured to switch from the first selected clock signal to a second selected clock signal in response to a second combination of the phase selection signal. The circuit disengages the first clock signal after the second phases selection signal is engaged.

16 Claims, 6 Drawing Sheets

HIGH SPEED PHASE SELECTOR

BACKGROUND OF THE INVENTION

The present invention relates generally to integrated circuits (ICs) and more particularly to a phase selection circuit that avoids glitches in the output signal during phase switching.

Phase selection is a popular technique used in digital timing recovery and digital phase locked loops (PLLs). Digital timing recovery and digital PLL schemes are well known in the art. In one circuit application, a clock generation source generates multi-phase clock signals with different phases. The circuit may include a multiplexer (MUX) that selects one clock signal with a given phase to be supplied as a single output clock. As applied to a PLL for example, a selected phase or clock can then be fed to a PLL for comparison.

A problem with the method described, however, is the potential for glitches in the output signal when the MUX is switching from one phase to another. Signal glitches are difficult to avoid, especially at high speeds. FIG. 1 shows a timing diagram illustrating the operation of a conventional phase selector that produces a glitch (undesirable clock transition edges) when the output switches from one clock (phase) signal to another.

Still referring to FIG. 1, two phases or clock signals Phase 2 and Phase 3 from a clock-generating source are muxed to an output Outclk of a phase selector. While other clock signals (not shown) could also be present, the example shows two for ease of illustration. A mux selection signal (not shown) switches the output Outclk from one phase to another. As shown, if the mux selection signal switches from Phase 2 to Phase 3 at time $t_1$, during the instant when Phase 2 is low and before Phase 3 goes low, a glitch would arise at output Outclk. Similarly, if the mux selection signal switches the output from Phase 2 to Phase 3 after Phase 2 goes high and before Phase 3 goes high, a glitch would arise. The duration of the glitch would depend on the precise time the transition occurs.

Such glitches at the phase selector output are undesirable because they cause erroneous output. Problems can manifest, for instance, when such a glitch triggers a counter. At high speeds timing the phase transition to avoid such glitches becomes increasingly difficult and unpredictable due to inherent delays in switching logic gates. Such propagation delays may prevent proper synchronization of the MUX transition to avoid the glitch.

With the ever-increasing demand for higher speed of operation for integrated circuits, there is a need for a phase selection circuit that avoids glitches in the output signal during phase switching.

The present invention satisfies these needs with a phase selection circuit that can operate without glitches at the output at both low and high speeds of operation while sustaining device functionality.

SUMMARY OF THE INVENTION

The invention provides a method and circuitry for selecting phases while avoiding glitches in the output signal during phase switching. In one embodiment, the present invention provides a phase selector circuit having a plurality of input terminals coupled to receive a respective plurality of clock signals having different phases, and a plurality of control terminals coupled to receive a respective plurality of phase selection signals. The circuit is configured to output a first selected clock signal from the plurality of clock signals in response to a first combination of the phase selection signals, and further configured to switch from the first selected clock signal to a second selected clock signal in response to a second combination of the phase selection signal. The first and second clock signals are engaged to the output simultaneously for a period of time such that a make-before-break operation occurs.

In another embodiment, present invention provides a first circuit configured to receive a plurality of clock signals having different phases, and to frequency divide the plurality of clock signals by N, and to multiply the number of phases by N, and to output the resulting clock signals, wherein N is greater than or equal to 2. The first circuit has a plurality of D-type flip-flop registers. The registers are serially coupled, and each register is configured to output a different phase. The registers are clocked by the clock signals.

In another embodiment, present invention provides a second circuit configured to receive clock signals from the first circuit, and to receive a first phase selection signal, and to output a first clock signal having a phase corresponding to the phase selection signal, and to switch from the first clock signal to a second clock signal when a second phase selection signal is received, and to prevent glitches during the transition.

In yet another embodiment, the second circuit has a plurality of selection circuits. Each selection circuit is configured to receive a clock signal outputted by the first circuit, configured to receive a phase selection signal corresponding to the clock signal, and configured to output the clock signal when the selection circuit is engaged by the phase selection signal. The phase selection circuits have outputs that are NORed with a wired-NOR type multiplexer. The second circuit further has a pull-up PMOS transistor coupled between a VCC source and the output, and the pull-up PMOS transistor has a gate coupled to a VSS source.

In yet another embodiment, at least one selection circuit has a D-type flip-flop register having an input configured to receive a phase selection signal and an output coupled to a first input of an AND gate. The register is clocked by a clock signal outputted by the first circuit, and the clock signal is inputted into a second input of the AND gate. An output of the AND gate is coupled to a gate of an NMOS transistor, and the transistor is coupled between the phase selector output and a VSS source, wherein the second circuit synchronizes the transitions of the phase selection signals to the falling edge of their corresponding clock signals.

A further understanding of the nature, objects, features, and advantages of the present invention is realized upon consideration of the latter portions of the specification including the accompanying drawings and appended claims.

Figure 5:
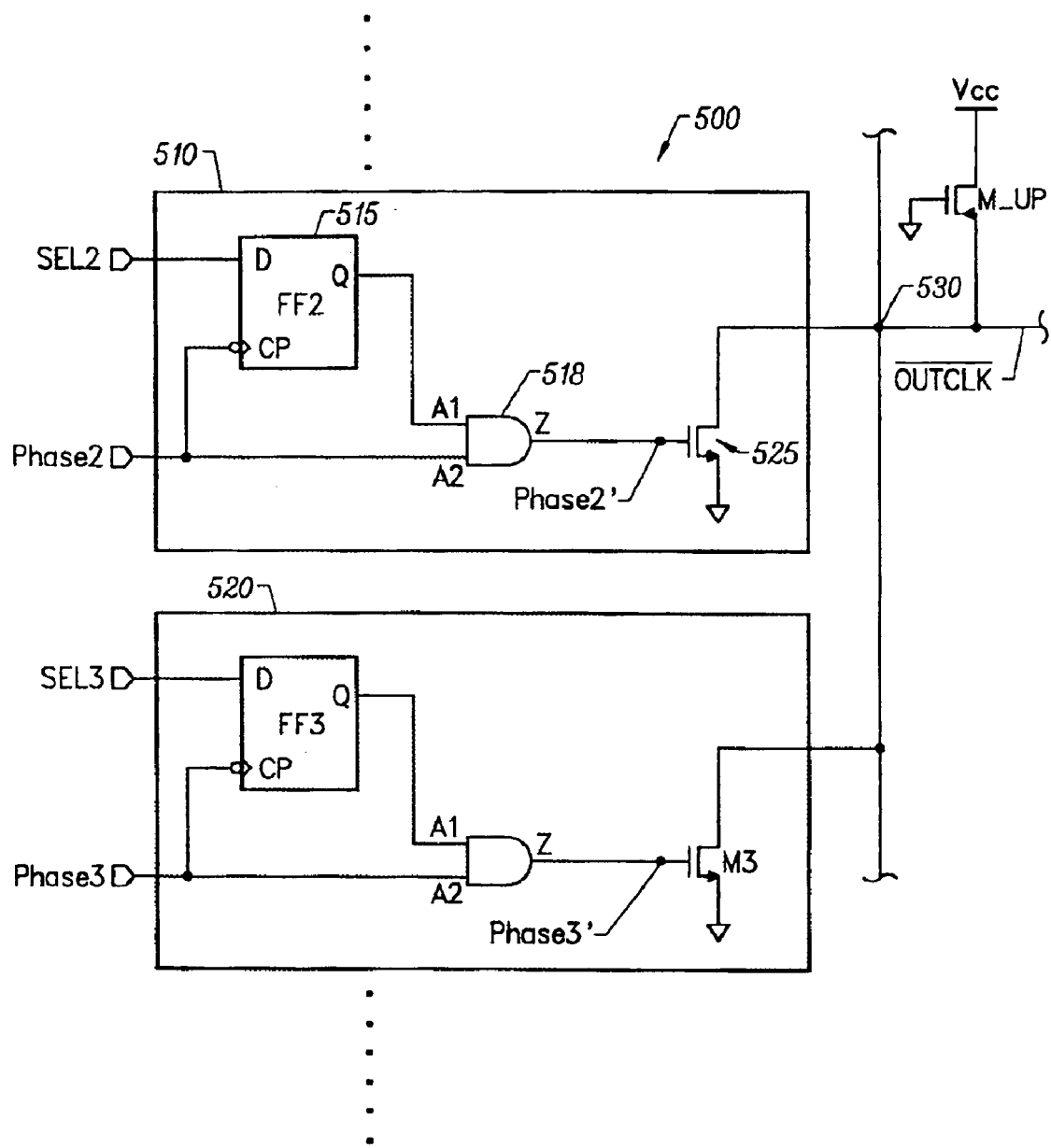
Figure 6:
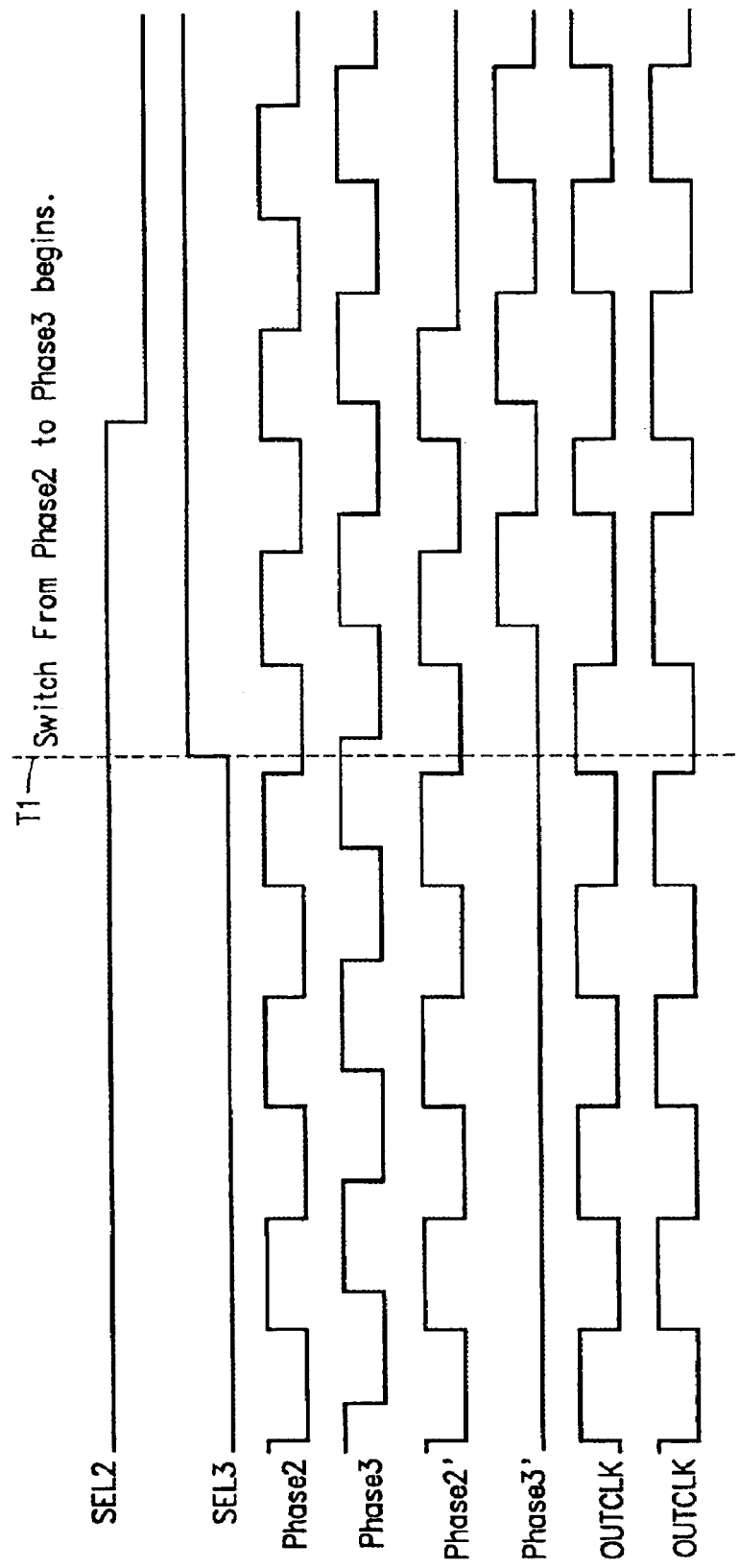

FIG. 5 shows a top-level schematic diagram of a phase switch mux circuit including two selection circuits, according to an embodiment of the present invention; and FIG. 6 shows a timing diagram illustrating the operation of a phase selector including two phase selection signals, two corresponding phase signals, and resulting glitch-free output signals, according to an embodiment of the present invention.

DESCRIPTION OF THE SPECIFIC EMBODIMENTS

With reference to the drawings, the phase selector method and the apparatus for carrying out the method according to the present invention is described below.

Figure 1:
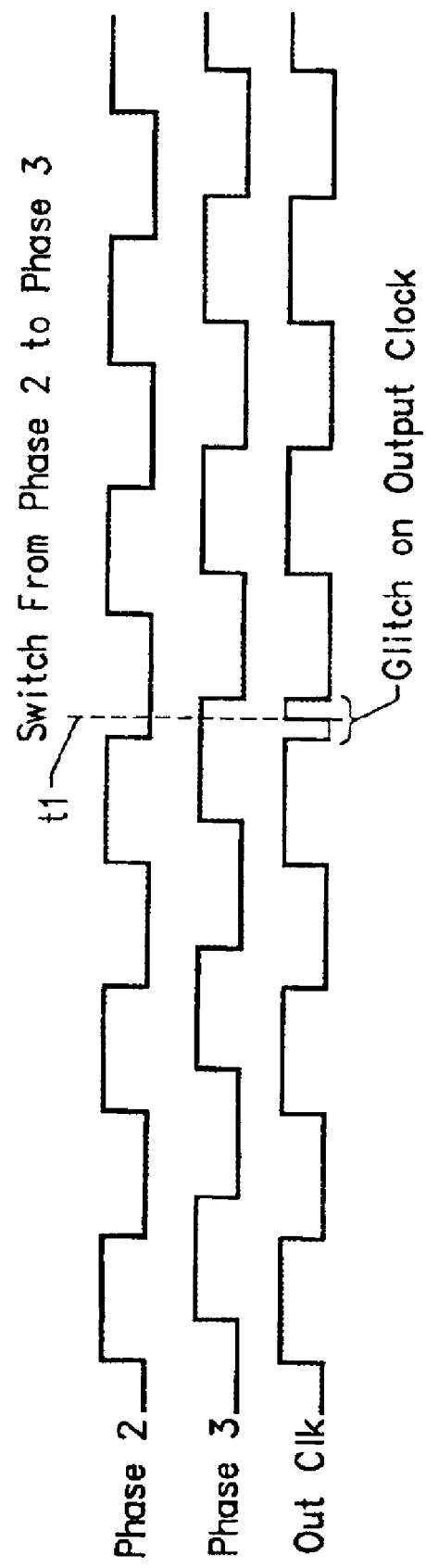
FIG. 1 shows a timing diagram illustrating the operation of a conventional phase selector that produces a glitch when the output switches from one clock signal to another.
Figure 2:
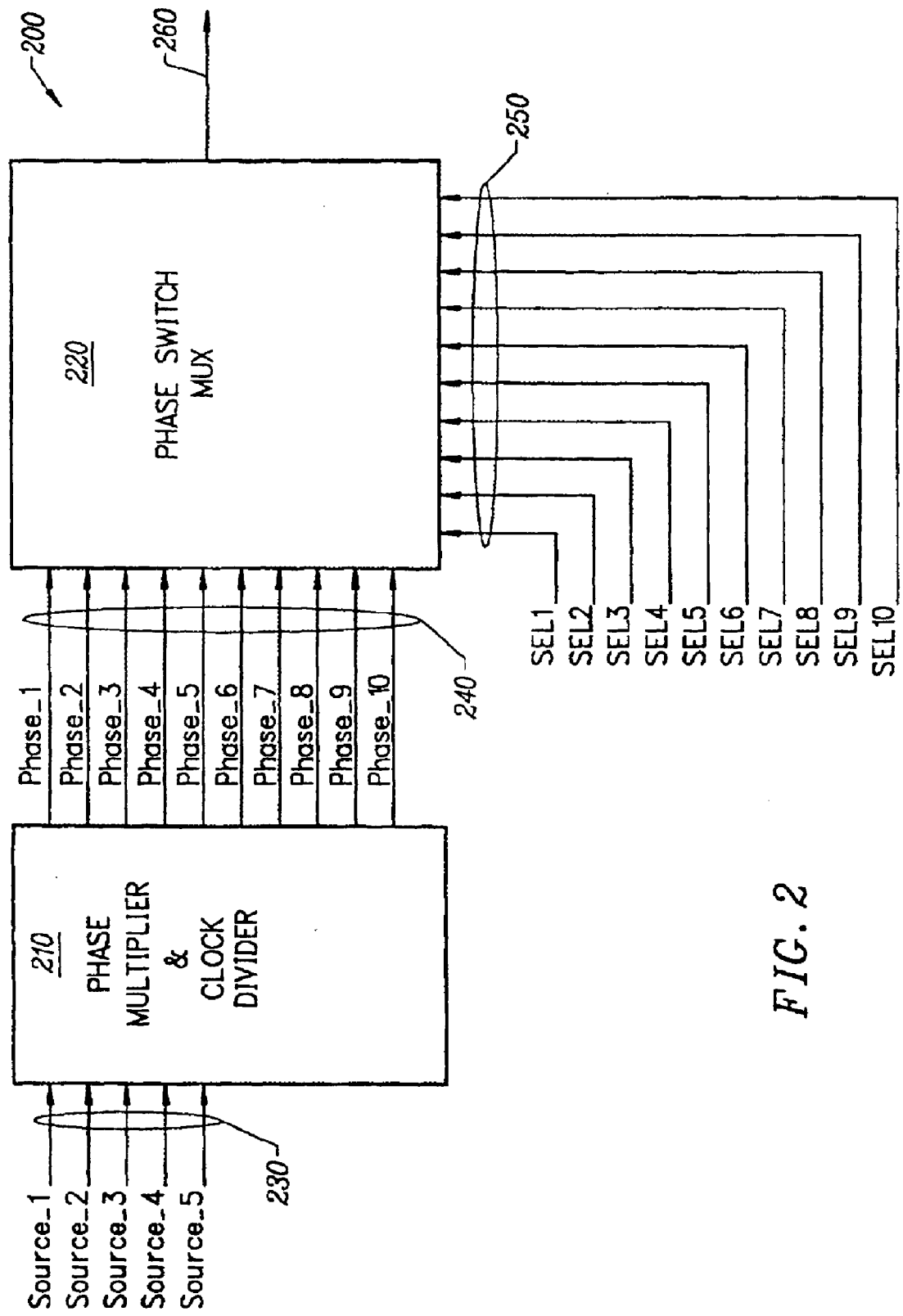
FIG. 2 shows a top-level block diagram of a phase selector including a phase multiplier and clock divider circuit and a phase switch mux circuit, according to an embodiment of the present invention.

FIG. 2 shows a top-level block diagram of a phase selector 200 including a phase multiplier and clock divider circuit 210 and a phase switch mux circuit 220, according to an embodiment of the present invention. In this embodiment, phase multiplier and clock divider (PMCD) circuit 210 couples to phase switch mux (PSM) circuit 220. In operation, PMCD circuit 210 receives M multi-phase clock or source signals 230 from a clock generation source (not shown), where M=5 in the example shown. The exact number M of multi-phase clock signals can vary and will depend on the specific application. In this specific embodiment, PMCD circuit 210 receives source signals 230, or signals Source 1 to Source 5. Circuit 210 then divides the frequency of signals 230 by N and generates N×M phases at its outputs. In this example, N=2 resulting in 10 phases. Circuit 210 then outputs intermediate phase signals 240. The exact number (N×M) of phase signals can vary and will depend on the specific application. In this specific embodiment, circuit 210 provides phase signals Phase 1 to Phase 10.

For high-speed applications, the time available to synchronize a clock phase to a clock selection signal is very small. Here, by reducing the clock frequency through division, the timing requirements for avoiding glitching is relaxed.

PSM circuit 220 muxes and outputs an output signal 260 without producing a glitch. In operation, circuit 220 receives phase signals 240, each of which has a different phase. Circuit 220 is configured to receive control or phase selection signals 250 the number of which depends on the number of phase signals. In this example, phase selection signals SEL 1 to SEL 10 constitute the control signals 250. Each phase selection signal corresponds to a different phase provided by control signals 250. Circuit 220 is configured to synchronize the phase selection signals to the corresponding phase signals 240. When a new phase selection signal is received by circuit 220, it outputs a new phase signal corresponding to the new phase selection signal.

To prevent glitching, circuit 220 disengages the first phase signal after the second phase selection signal is received, and engages the second phase signal before the first phase is disengaged.

Figure 3:
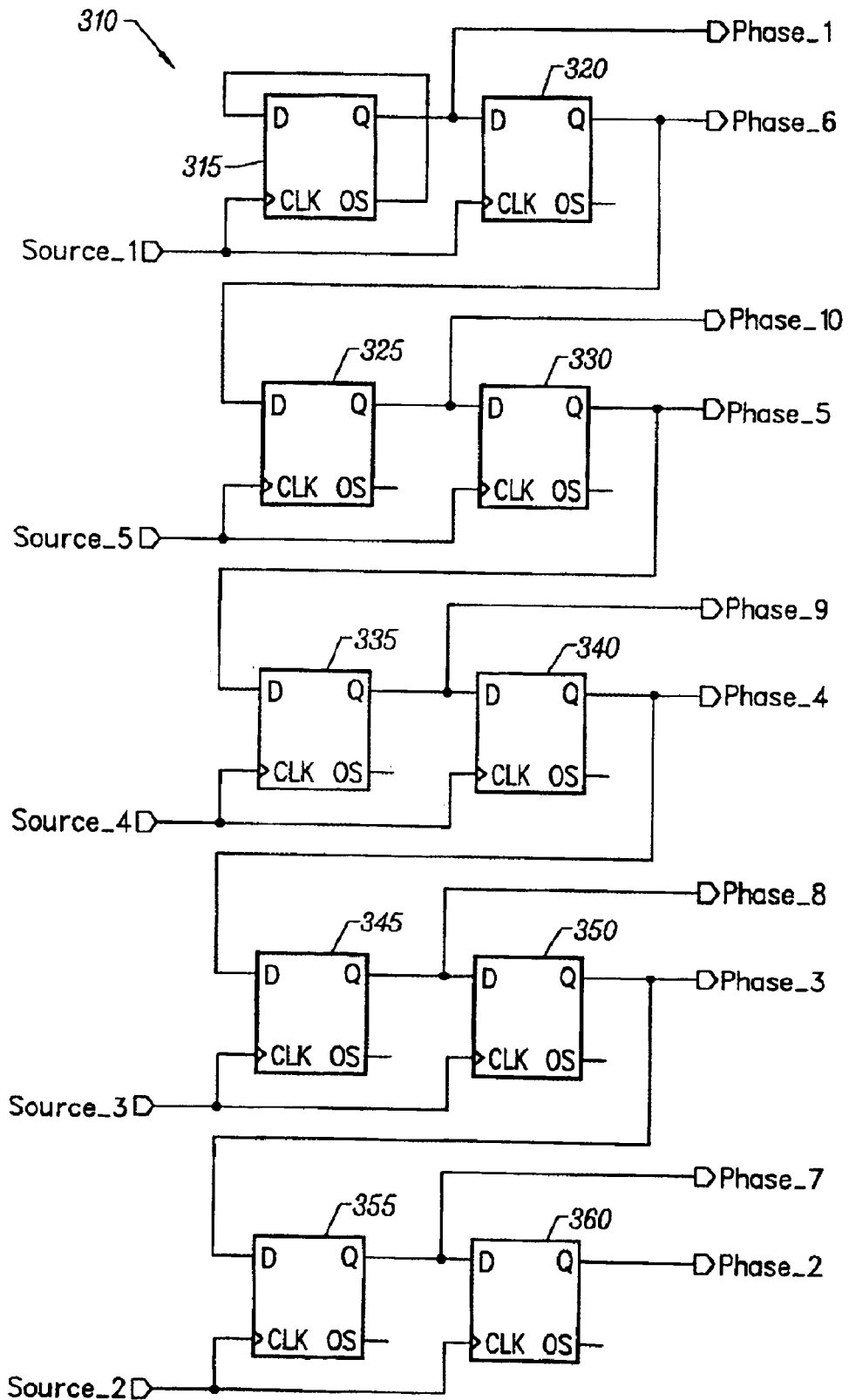
FIG. 3 shows top-level schematic diagram of a phase multiplier and clock divider circuit including registers, according to an embodiment of the present invention.

FIG. 3 shows a top-level schematic diagram of a phase multiplier and clock divider circuit 310 including a chain of shift registers 315–360, according to an embodiment of the present invention. A multi-phase source drives the various stages of shift registers 315–360. In this example, D-type flop-flop registers are used. Registers 315–360 are each clocked by one of source signals Source 1 to Source 5. For instance, registers 315 and 320 are clocked by Source 1. Likewise, registers 325 and 330 are clocked by Source 5. The exact groupings will depend on the specific application.

Registers 315–360 output intermediate phase signals Phase 1 to Phase 10. In a specific embodiment, the register 315 is a divide-by-2 circuit. Register 315 generates phase signal Phase 1. Phase 1 in turn drives a D input of register 320, the next register in the chain. Register 320 generates Phase 6 output signal, which is the compliment of Phase 1, and drives a D input of register 325, the next register in the chain. Continuing, register 325 generates signal Phase 10 and Phase 10 in turn drives a D input of register 330. Register 330 generates Phase 5 which drives a D input of register 335, and so on. The resulting output clocks signals Phase 1 to Phase 10 are thus half in frequency and double in phase. The exact groupings and the number of phase signals will depend on the specific application. For example, the specific circuit of FIG. 3 minimizes any phase uncertainties that may result from simply dividing each input source by two. It, also, ensures that the generated phases are not skewed. Also, the sequence of connections is based on optimized set-up and hold times for the flip-flops. It is to be understood that this specific implementation is provided herein for illustrative purposes only, and that alternative circuit implementations exist for the same functionality.

Figure 4:
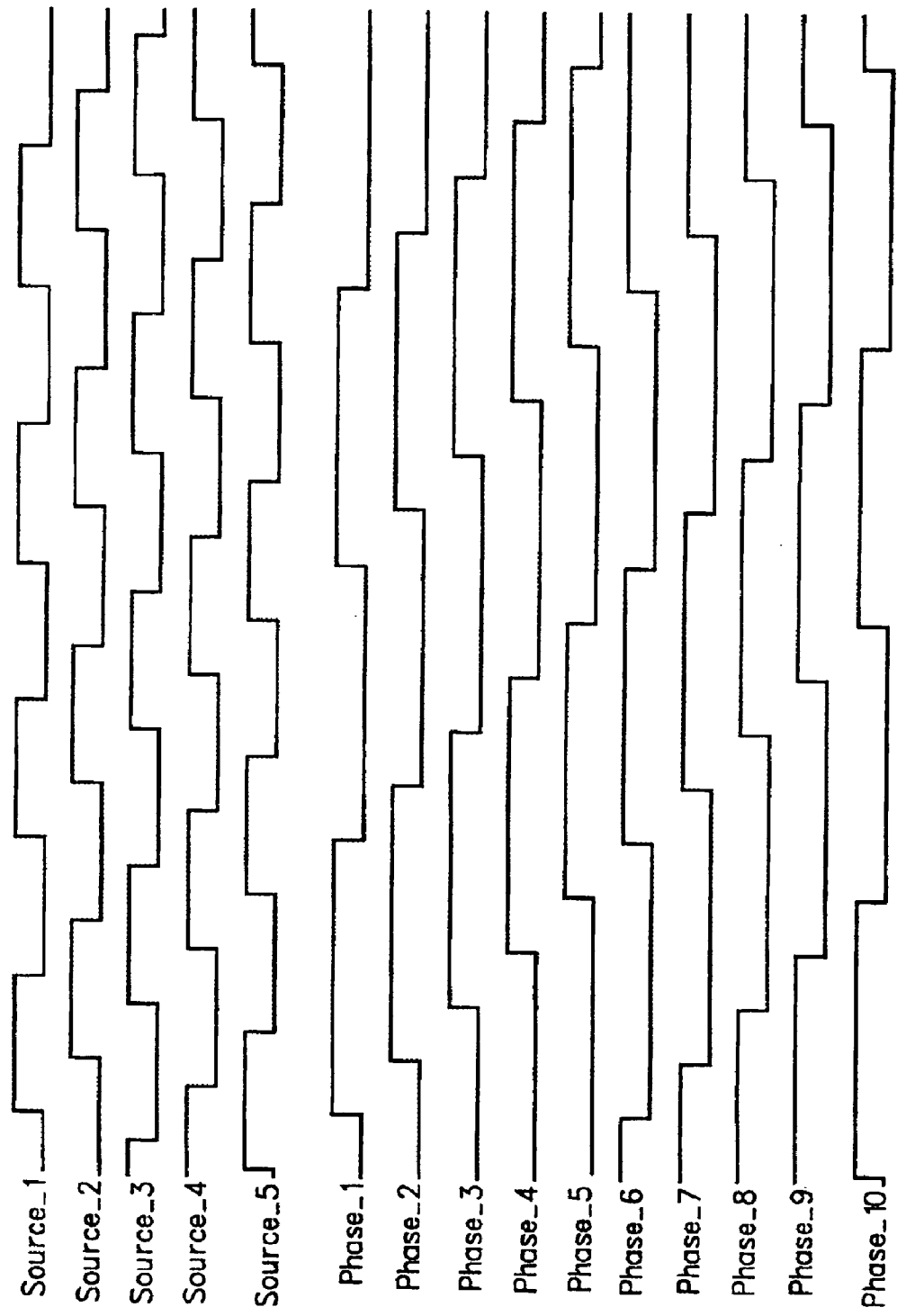
FIG. 4 shows a timing diagram illustrating the operation of the phase multiplier and clock divider circuit of FIG. 3 including clock signals entering the phase multiplier and clock divider circuit and resulting clock signals exiting the circuit.

FIG. 4 shows a timing diagram illustrating the operation of the phase multiplier and clock divider circuit 310 of FIG. 3 including clock signals Source 1 to Source 5 entering circuit 310 and resulting clock signals Phase 1 to Phase 10 exiting the circuit. In this specific embodiment, signals Source 1 to Source 5 are equally spaced such that they are 72° apart (360°/5 signals). Phase signals Phase 1 to Phase 10 are half in frequency and equally spaced 36° apart (360°/10 signals). Note that due to the divide-by-two operation, 36° phase steps of the slower clock correspond to 72° phase step for the original clock. Hence, phase resolution remains constant.

Alternative embodiments can achieve the same results, that is, resulting in output signals Phase 1 to Phase 10 that are half in frequency and double in phase. For example, circuit 310 could include a chain of five shift registers that operate similarly to the chain of ten registers described above. Each register could output a phase signal and a compliment of that phase signal, where an inverter coupled to the register output could provide the compliment. Thus, the 5 registers would produce 10 different phase signals Phase 1 to Phase 10. When 5 registers are used, as just described, a timing mismatch between each output and its compliment will be introduced which may result in increased jitter. Thus, using ten shift registers as shown in FIG. 3 is preferred.

FIG. 5 shows a top-level schematic diagram of a phase switch mux circuit 500 including two selection circuits 510 and 520, according to an embodiment of the present invention. In this specific embodiment, selection circuit 510 includes a negative-edge triggered D-type flip-flop register 515 which has an input configured to receive phase selection signal SEL2 and has an output coupled to a first input of an AND gate 520. Register 515 is clocked by signal Phase 2. Also, Phase 2 is inputted into a second input of AND gate 520. An output of AND gate 520 couples to a gate of a transistor 525 which couples between the phase selector output node 530 and a VSS source. In this specific embodiment, transistor 525 is an NMOS transistor. Selection circuit 520 can be configured similarly to circuit 510 and is identical to circuit 510 in the embodiment of FIG. 5.

The output nodes of phase selection circuits 510 and 520 are multiplexed. This can be accomplished with an NOR-type multiplexer, or a wired NOR-type multiplexer as shown in FIG. 5, or by some other appropriate method. Phase switch mux circuit 500 can also include a pull-up PMOS transistor coupled between a VCC source and the output nodes. The pull-up PMOS transistor has a gate coupled to a VSS source. In operation, generally, mux circuit 500 outputs a phase signal corresponding to the phase selection signal that is selected. For example, circuit 500 would output phase signal Phase 2 if phase selection signal SEL2 were selected.

Specifically, selection circuits 510 and 520 first receive multi-phase clock input signals Phase 2 and Phase 3, respectively. Again, referring back to the embodiment of FIG. 2, Phase 2 and Phase 3 signals can be generated by circuit 210. Specifically, mux circuit 500 first synchronizes the transitions of the phase selection signals to the falling edge of their corresponding clock signals. In this particular embodiment, it accomplishes this with negative-edge triggered D-type flip-flop register 515. Other appropriate methods can also be used to achieve the same objective. For example, positive-edge triggered registers can be used, of course with additional and appropriate modifications, to synchronize the rising edges of the signals.

Next, when a new phase selection signal is activated, a selection circuit corresponding to the new phase engages a corresponding clock signal. The selection circuit, corresponding to the prior or first phase, disengages the first clock signal but not until after the selection circuit, corresponding to the new phase, engages the new clock signal. This is also referred to in the art as "make-before-break." The newly engaged selection circuit then passes the new corresponding phase signal to the output. For example, still referring to FIG. 5, if signal Phase 2 is being outputted at node 530 and selection signal SEL3 is subsequently selected (goes high), the corresponding selection circuit 520 becomes engaged and passes the corresponding phase signal Phase 3 to output node 530.

Phase selection signal SEL2 will continue to engage selection circuit 510 such that both phase signals Phase 2 and Phase 3 are outputted at node 530 simultaneously. The overlap duration will depend on the specific application. Also, the control over the overlap 1 duration can be provided by appropriate software, hardware, or combination thereof (not shown). Such control logic is well known in the art.

In this example, register 515 synchronizes the control signal to the falling edge of Phase 2 such that when selection signal SEL2 goes low to disengage selection circuit 510, Phase 2 will continue to be outputted to output node 530 for a short while. An overlap thus results.

It is to be understood that the circuit as depicted and described herein is only one specific implementation provided for illustrative purposes only. Other alternative circuit implementations exist that implement the same functionality. While FIG. 5 shows two selection circuits 510 and 520 for illustration purposes, more selection circuits can be employed to provide more selection and phase signals. For example, selection signals SEL2 and SEL3 signals can be included in a larger set of mux selection control signals such as signals SEL1 to SEL10 of FIG. 2. Again, a wired-NOR type multiplexer can be used to complete the phase selection process.

FIG. 6 shows a timing diagram illustrating the operation of a phase selector including two phase selection signals SEL2 and SEL3, two corresponding phase signals Phase 2 and Phase 3, and resulting phase signals Phase 2' and Phase 3', and resulting glitch-free output signals according to an embodiment of the present invention.

As shown, the phase selector switches from phase signal Phase 2 to Phase 3, beginning at time T1. Specifically, signal SEL2 has gone low to disengage signal Phase 2 and signal SEL3 goes high to engage signal Phase 3. According to the invention, Phase 2 is not disengaged until after Phase 3 is engaged. As a result, the signal Phase 2 transition from being engaged to disengaged is delayed. Phase 2' and Phase 3' are gated version Phase 2 and Phase 3, respectively, as seen in FIG. 5. Referring to signal Phase 2', it is disengaged on the next falling edge of Phase 2, after SEL2 has gone low. Likewise, referring to signal Phase 3', it is engaged on the next falling edge of Phase 3, after SEL3 has gone high. The resulting Phase 2' and Phase 3', in conjunction with the wired-NOR that follows, ensure glitch-free phase transition.

In conclusion, it can be seen that the present invention provides numerous advantages. Principally, it eliminates problems and limitations resulting from glitching in high-speed circuits. Specific embodiments of the present invention are presented above for purposes of illustration and description. The full description will engage others skilled in the art to best utilize and practice the invention in various embodiments and with various modifications suited to particular uses. After reading and understanding the present disclosure, many modifications, variations, alternatives, and equivalents will be apparent to a person skilled in the art and are intended to be within the scope of this invention. Therefore, it is not intended to be exhaustive or to limit the invention to the specific embodiments described, but is intended to be accorded the widest scope consistent with the principles and novel features disclosed herein, and as defined by the following claims.

What is claimed is:

1. A high speed phase selector comprising:
   a first circuit configured to receive a plurality of clock signals having different phases, and to frequency divide the plurality of clock signals by N, and to multiply the number of phases by N, and to output the resulting clock signals; and
   a second circuit configured to receive clock signals front the first circuit and to receive a first phase selection signal, to output a first clock signal having a phase corresponding to the first phase selection signal, to switch from the first clock signal to a second clock signal when a second phase selection signal is received, to prevent glitches during the transition, the second circuit synchronizing the transitions of the first and second phase selection signals to the falling edge of their corresponding clock signals, the second circuit engaging the second clock signal when selected and disengaging the first clock signal after the second clock is engaged, wherein the first circuit comprises a plurality of registers, the registers being serially coupled, each register being configured to output a different phase.

2. A phase selector of claim 1 wherein the first register of the plurality of registers is a divide-by-two circuit.

3. A phase selector of claim 1 wherein the phases are not skewed.

4. The first circuit of claim 1 wherein one input clock generates a divide-by-2 output and subsequent phases are derived through sequential sampling of the divide-by-2 output.

5. The phase selector of claim 1 wherein N is greater than or equal to 2.

6. The phase selector of claim 1 wherein the second circuit synchronizes the transitions of the phase selection signals to the falling edge of their corresponding clock signals.

7. A phase selector of claim 1 wherein the second circuit comprises at least first and second selection circuits, each of the at least first and second selection circuits being associated with and configured to receive one of the clock signals outputted by the first circuit, and each of the at least first and second selection circuits being associated with and further configured to receive one of the first and second phase selection signals, wherein each of the at least first and second selection circuits is further configured to output its associated clock signal when that selection circuit is engaged by its associated phase selection signal, the phase selector comprising a logical NOR circuit for performing a logic NOR on the output clock signals.

8. The phase selector of claim 7 wherein at least one of the first and second selection circuits comprises a register having an input configured to receive the phase selection signal associated with the at least one of the first and second selection circuits and an output coupled to a first input of an AND gate, the register being clocked by a clock signal outputted by the first circuit, the clock signal being inputted into a second input of the AND gate, an output of the AND gate being coupled to a gate of a transistor, the transistor being coupled between the phase selector output and a VSS source.

9. The phase selector of claim 8 wherein at least one register is a D-type flip-flop.

10. The phase selector of claim 8 wherein at least one register is negative-edge triggered.

11. The phase selector of claim 8 wherein the transistor is an NMOS transistor.

12. The phase selector of claim 8 further comprising a pull-up transistor coupled between a VCC source and the output, the pull-up transistor having a gate coupled to a VSS source.

13. The phase selector of claim 12 wherein the pull-up transistor is a PMOS transistor.

14. The phase selector of claim 7 wherein the logical NOR circuit comprises a multiplexer.

15. The phase selector of claim 7 wherein the logical NOR circuit comprises a wired NOR-type multiplexer.

16. A high speed phase selector comprising:

a first circuit configured to receive a plurality of clock signals having different phases, and to frequency divide the plurality of clock signals by N, and to multiply the number of phases by N, and to output the resulting clock signals, wherein N is greater than or equal to 2, the fist circuit comprises a plurality of D-type flip-flop registers, the registers being serially coupled, each register being configured to output a different phase, the register being clocked by the clock signals; and a second circuit configured to receive clock signals from the first circuit, and to receive a first phase selection signal, and to output a first clock signal having a phase corresponding to the first phase selection signal, and to switch from the first clock signal to a second clock signal when a second phase selection signal is received, and to prevent glitches during the transition, the second circuit comprising at least first and second selection circuits, each of the at least first and second selection circuits being associated with and configured to receive one of the clock signals outputted by the first circuit, and each of the at least first and second selection circuits being associated with and further configured to receive one of the first and second phase selection signals, wherein each of the at least first and second selection circuits is further configured to output its associated clock signal when that selection circuit is engaged by its associated phase selection signal, the phase selector having outputs that are NORed with a wired NOR-type multiplexer, the second circuit further comprising a pull-up PMOS transistor coupled between a VCC source and the output, the pull-up PMOS transistor having a gate coupled to a VSS source, at least one of the first and second selection circuits comprising a D-type flip-flop register having an input configured to receive the phase selection signal associated with the at least one of the first and second its associated and an output coupled to a first input of an AND gate, the register being clocked by a clock signal outputted by the first circuit, the clock signal being inputted into a second input of the AND gate, an output of the AND gate being coupled to a gate of an NMOS transistor, the transistor being coupled between the phase selector output and a VSS source;

wherein the second circuit synchronizes the transitions of the phase selection signals to the falling edge of their corresponding clock signals, engages the second clock signal when selected, and disengages the first clock signal after the second clock is engaged.

* * * * *